(12) United States Patent
Kessler et al.

(10) Patent No.: US 10,411,181 B2
(45) Date of Patent: Sep. 10, 2019

(54) ELECTRICAL VIA PROVIDING ELECTRODE PAIR ACCESS ON A SINGLE SIDE OF A DEVICE

(71) Applicant: Metis Design Corporation, Boston, MA (US)

(72) Inventors: Seth S. Kessler, Newton, MA (US); Christopher T. Dunn, Salem, MA (US)

(73) Assignee: Metis Design Corporation, Boston, MA (US)

( * ) Notice: Subject to any disclaimer, the term of this patent is extended or adjusted under 35 U.S.C. 154(b) by 0 days.

(21) Appl. No.: 15/992,937

(22) Filed: May 30, 2018

(65) Prior Publication Data

US 2018/0351073 A1    Dec. 6, 2018

Related U.S. Application Data

(60) Provisional application No. 62/512,339, filed on May 30, 2017.

(51) Int. Cl.
*H01L 41/04* (2006.01)
*H01L 41/047* (2006.01)
(Continued)

(52) U.S. Cl.
CPC ...... *H01L 41/0472* (2013.01); *H01L 41/0475* (2013.01); *H01L 41/08* (2013.01); *H01L 41/293* (2013.01)

(58) Field of Classification Search
CPC .......................... H01L 41/0472; H01L 41/293
(Continued)

(56) References Cited

U.S. PATENT DOCUMENTS 6,806,626 B2 * 10/2004 Morinaga .............. H03H 9/177
                                                          310/320
7,982,363 B2 *  7/2011 Chitnis ..................... H03H 3/04
                                                          310/313 R
(Continued)

FOREIGN PATENT DOCUMENTS

CN          205177885 U      4/2016
JP          2004-207693 A    7/2004
(Continued)

OTHER PUBLICATIONS

International Search Report and Written Opinion for International Patent Applicatoin PCT/US2018/035117 by International Searching Authority dated Sep. 10, 2018.

*Primary Examiner* — J. San Martin
(74) *Attorney, Agent, or Firm* — McCarter & English, LLP; David R. Burns (57) ABSTRACT

Devices and methods described herein provide electrode pair access from a single side of a device by using one or more via holes through the device. The via hole can pass through or near the center of the device. By creating a conductive path through the via hole of the device, devices and methods of the present disclosure advantageously provide access to a pair of electrodes, each of which contacts a different side of a device layer, on a single side of the device while enabling a greater active device area than is possible using conventional techniques. In addition, the central location of the via hole provides favorable mechanical properties by avoiding radial constriction of the device layers in applications such as piezoelectric devices.

20 Claims, 9 Drawing Sheets

(51) Int. Cl.
*H01L 41/08* (2006.01)
*H01L 41/293* (2013.01)

(58) Field of Classification Search
USPC .......................................... 310/365
See application file for complete search history.

(56) References Cited

U.S. PATENT DOCUMENTS

| | | | | |
|---|---|---|---|---|
| 8,570,110 B2* | 10/2013 | Mizusawa | ............ | H03H 9/1035 |
| | | | | 310/344 |
| 8,610,337 B2* | 12/2013 | Kawahara | ............... | H01L 23/10 |
| | | | | 310/344 |
| 2009/0179526 A1* | 7/2009 | Bindig | ................... | H04R 17/00 |
| | | | | 310/365 |
| 2011/0115342 A1* | 5/2011 | Yang | ...................... | H03H 9/215 |
| | | | | 310/365 |

FOREIGN PATENT DOCUMENTS

| | | |
|---|---|---|
| JP | 2015-70093 A | 4/2015 |
| KR | 10-2014-0096886 A | 8/2014 |

\* cited by examiner

ELECTRICAL VIA PROVIDING ELECTRODE PAIR ACCESS ON A SINGLE SIDE OF A DEVICE

RELATED APPLICATIONS

This application claims priority to U.S. Provisional Application No. 62/512,339, filed May 30, 2017, the entire contents of which is incorporated herein by reference.

BACKGROUND

Many devices that either generate an electric potential (for example, a solar cell or piezoelectric sensor), store an electric potential (for example, a battery or capacitor), or use an electric potential (for example, an electroactive polymer or piezoelectric actuator) require electrodes to be applied to a top and bottom surface at least partially surrounding a device layer, which can include a dielectric material. In many of these applications however, the need to access both top and bottom surfaces can limit the effectiveness of the device or often make it impractical. For example, actuators and sensors are often times intimately bonded to a surface, thus blocking access to one of these electrodes.

SUMMARY

An electrical device having one or more electrical via holes providing electrode pair access from a single side of the device is described herein. The device includes a top electrode on at least a portion of a top surface of the device. The device includes a bottom electrode on at least a portion of a bottom surface of the device. The device includes a device layer disposed between the top electrode and the bottom electrode. The device includes a via hole including a conductive sidewall in electrical contact with a pad electrode disposed on the top surface of the device. The device includes an insulating gap separating the pad electrode from the top electrode.

A method of producing an electrical device having one or more electrical via holes providing electrode pair access from a single side of the device is described herein. The method includes receiving a device layer. The method includes forming a via hole through the device layer. The method includes disposing a bottom electrode on at least a portion of a bottom surface of the device layer. The method includes disposing a conductive sidewall on an inner diameter of the via hole. The method includes disposing a pad electrode on a top surface of the device layer. The pad electrode is in electrical contact with the bottom electrode through the conductive sidewall. The method includes disposing a top electrode on at least a portion of the top surface of the device layer. The top electrode is separated from the bottom electrode by an insulating gap.

BRIEF DESCRIPTION OF THE DRAWINGS

The skilled artisan will understand that the drawings are primarily for illustrative purposes and are not intended to limit the scope of the subject matter described herein. The drawings are not necessarily to scale; in some instances, various aspects of the subject matter disclosed herein may be shown exaggerated or enlarged in the drawings to facilitate an understanding of different features. In the drawings, like reference characters generally refer to like features (e.g., functionally similar or structurally similar elements).

The foregoing and other features and advantages provided by the present disclosure will be more fully understood from the following description of exemplary embodiments when read together with the accompanying drawings, in which.

DETAILED DESCRIPTION

Devices and methods described herein provide electrode pair access on a single side of the device by using one or more via holes through the device. The via hole can pass through the center of the device in some embodiments. By creating a conductive path through the via hole of the device, devices and methods of the present disclosure advantageously provide access to a pair of electrodes, each of which contacts a different side of a device layer, on a single side of the device while enabling a greater active device area than is possible using conventional techniques. In addition, the central location of the via hole provides favorable mechanical properties by avoiding radial constriction of the device layers in applications such as piezoelectric devices.

Electrical devices that include a stack of vertical layers and that generate, store, or use electric potential can include piezoelectric sensors and actuators, batteries, solar cells, capacitors, electroactive polymers, and sensors such as Hall-effect sensors. A piezoelectric wafer has a bottom electrode and a top electrode, but many applications including sensing and actuation utilize the piezo wafer by bonding one surface (e.g., the bottom) to an object. By bonding the device to the object, electrical connection to the electrode is physically blocked from the bonded surface and must occur at another point on the device.

As used herein, an "effective" area of a device is the area as measured on the top or bottom surface of the device that contributes to storage, usage, or generation of electrical potential. In some cases, the effective area of the device is the area where a device layer is sandwiched between electrodes. The ineffective area of the device is the remainder of the total device area that is not effective, i.e., that does not contribute to storage, usage, or generation of electrical potential.

Figures 1A, 1B:
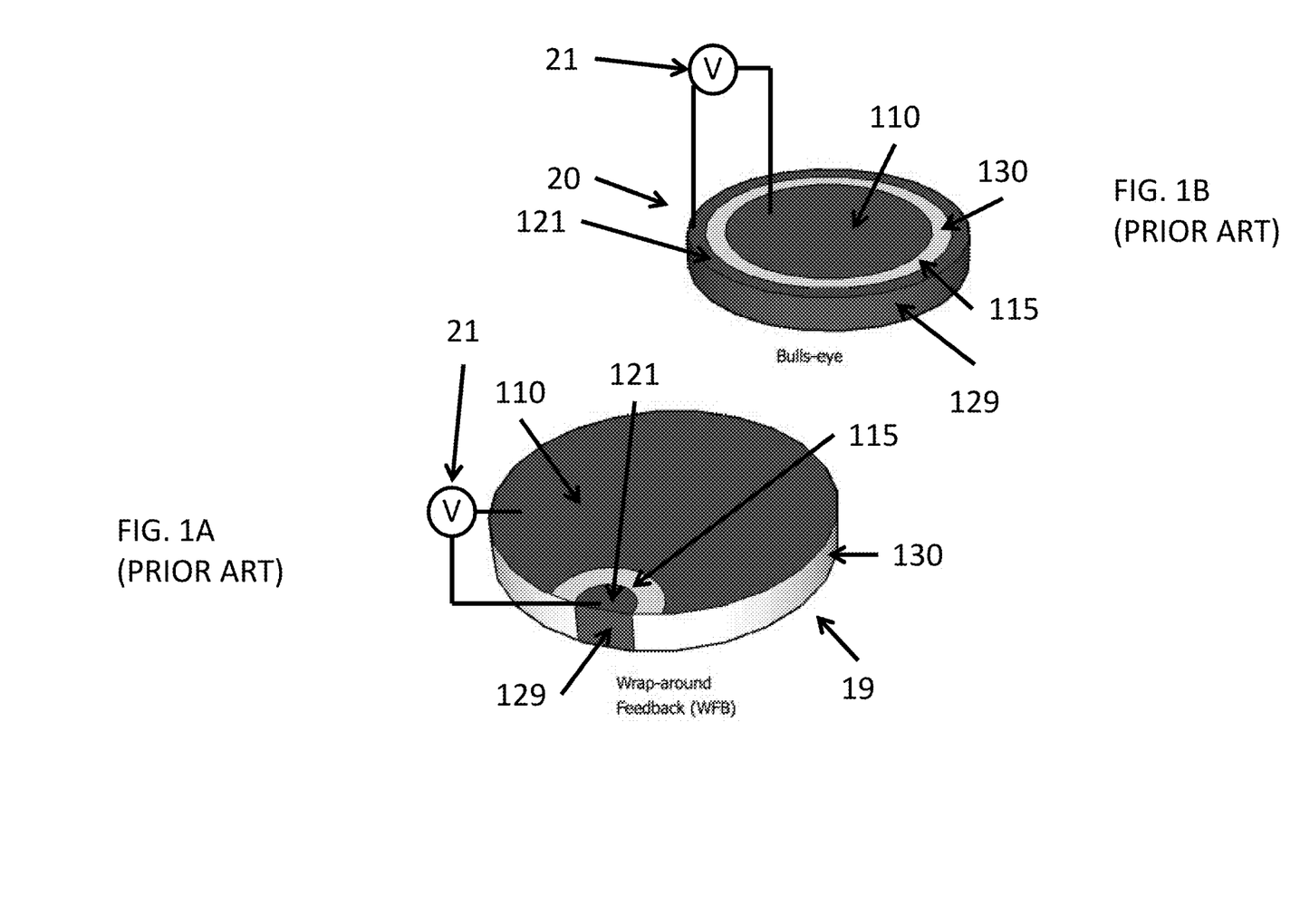
FIGS. 1A and 1B illustrate prior art electrical devices with prior art electrode layouts.
Figure 2A:
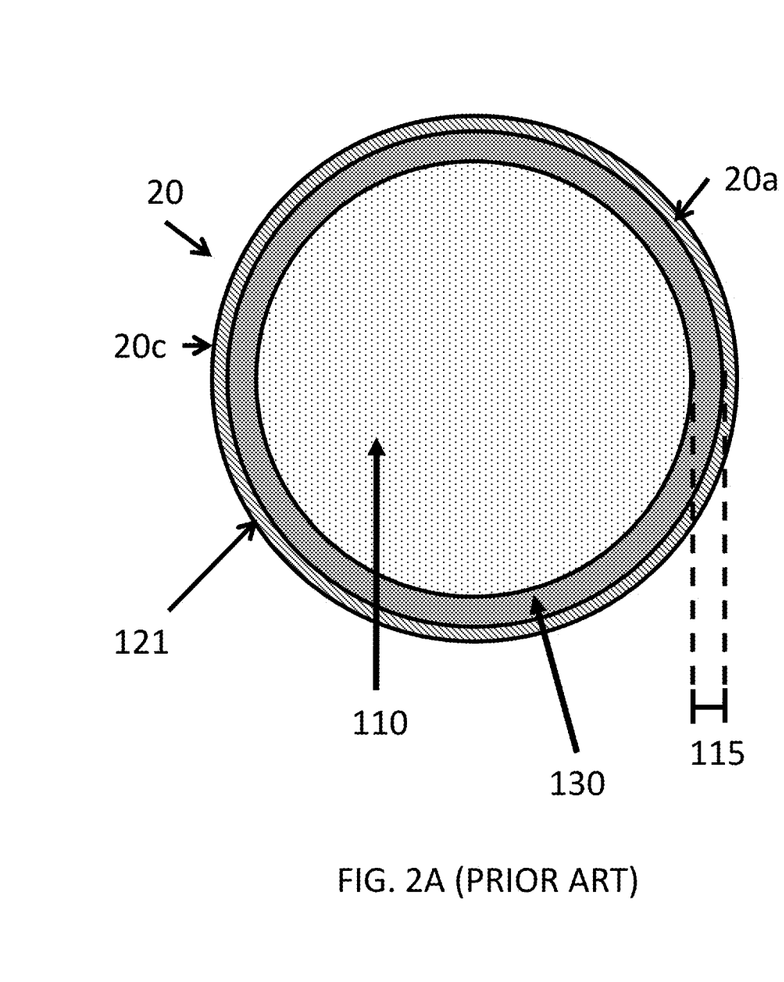
FIGS. 2A-2D illustrate top, bottom, edge, and center cross-sectional views, respectively, of an electrical device employing a prior art bull's eye electrode.
Figure 2B:
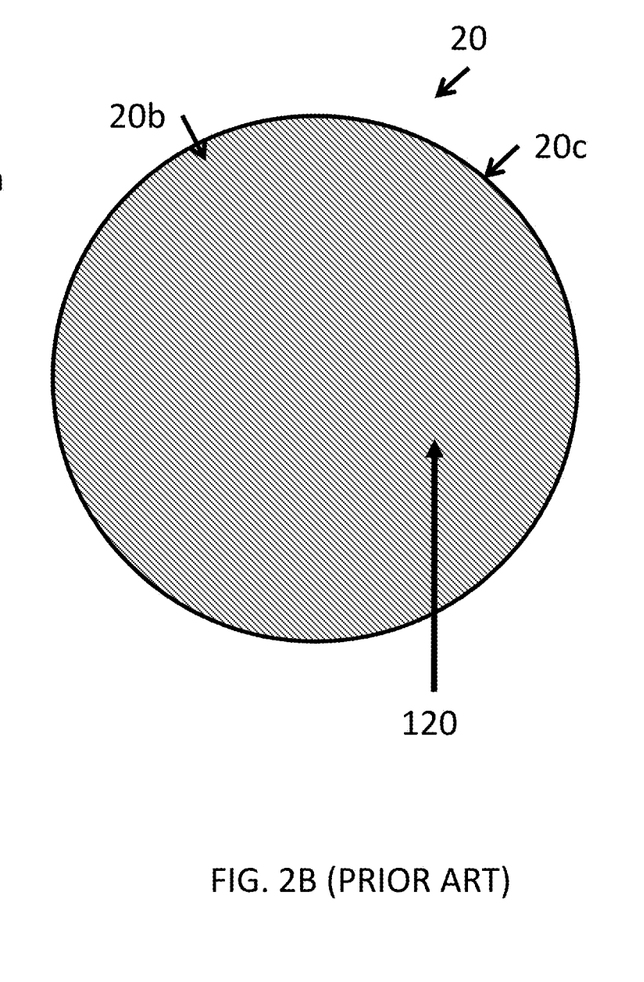
Figure 2C:
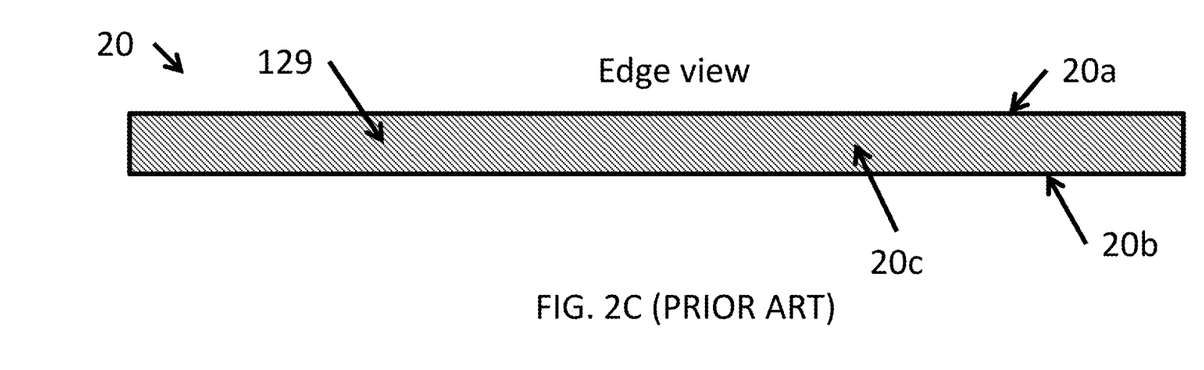
Figure 2D:
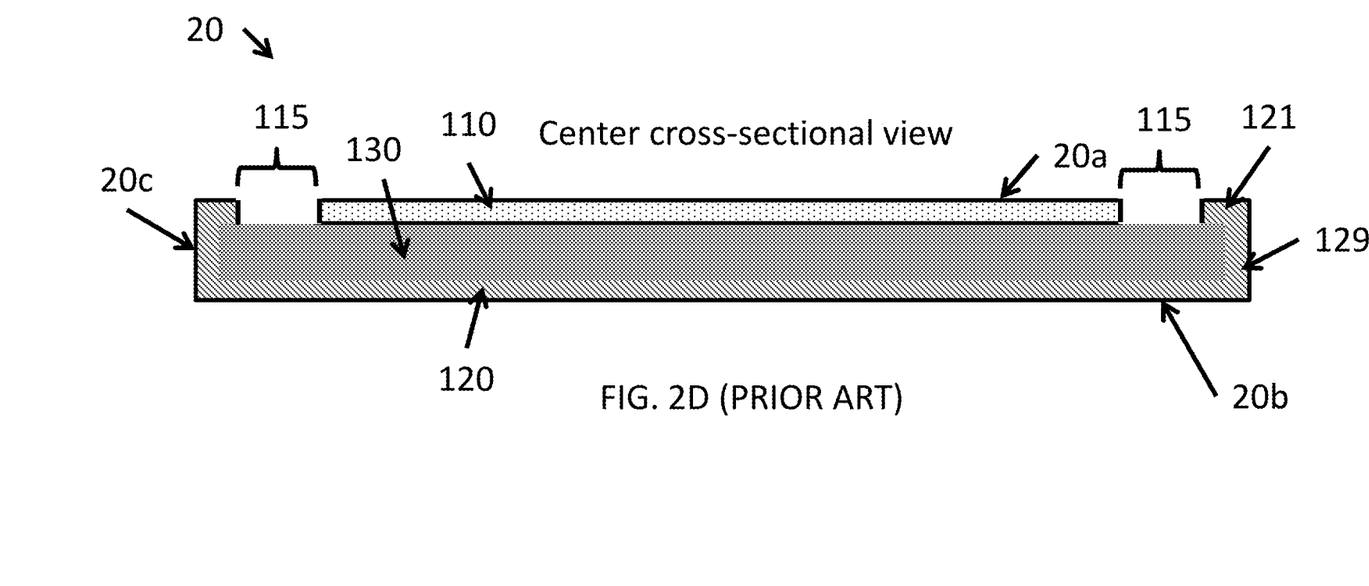

FIGS. 1A and 1B illustrate prior art electrical devices with prior art electrode layouts. In the devices shown in FIGS. 1A and 1B, both sets of electrodes are brought onto a top surface of the device. In both devices, one of the electrodes (e.g., the bottom electrode) is connected to a conductive band that extends partially or entirely around the outer perimeter of the device. The conductive band is electrically connected to the surface (e.g., the top surface) opposite the electrode.

FIG. 1A illustrates a device 19 including a top electrode 110 and a bottom electrode (not depicted in this view) sandwiching an insulating device layer 130. A ground trace 129 connects to the bottom electrode and extends around a portion of the perimeter of the device. The ground trace 129 then connects to a circular electrode pad 121 on the top surface of the device at the outer perimeter. An insulating gap 115 exists between the circular electrode pad 121 and the larger top electrode 110. This approach creates asymmetry in the device 19 that causes problems in certain sensing and actuating applications. For example, an asymmetric actuator or sensor can include areas with reduced capabilities like areas that are less sensitive to damage detection or sonar response. This reduces the practicality, effectiveness, and reliability of the respective system incorporating such a sensor or actuator.

FIG. 1B illustrates a bull's eye device 20 including the top electrode 110, the bottom electrode 120 (not shown in this view), and the device layer 130. In the bull's-eye device 20, the bottom electrode electrically connects to a conductive band 129 that extends around the entire circumference of the device. The conductive band 129 connects to an annular pad 121 around the outside perimeter at the top surface of the device 20. The insulating gap 115 separates the annular pad 121 from the top electrode 110 and can be equal in thickness to the device thickness. Although symmetric, the bull's eye device 20 has a large portion of the outside perimeter of the device 20 that is largely ineffective as described in greater detail below.

Moreover, the bull's eye design of device 20 has other drawbacks for certain device types. For example, the conductive band 129 acts like a container around the device making it mechanically challenging for the inner parts to function. For example, mechanical motion (e.g., radial expansion and contraction) of the device layer 130 in a piezoelectric device is hindered by the conductive band 129. Vertical and horizontal motion are also hindered or restricted by the conductive band 129, the annular pad 121, and the bottom electrode 120. Devices and methods of the present disclosure address these problems by electrically connecting a pad electrode to the bottom electrode through a via hole located in or near a central axis or central point of the device rather than around the perimeter of the device as described in greater detail below.

FIGS. 2A-2D illustrate top, bottom, edge, and center cross-sectional views, respectively, of the electrical device 20 of FIG. 1A employing a prior art electrode. The device 20 includes the bottom electrode 120 on a bottom surface 20b that electrically connects to the conductive band 129 around the outer sidewall 20c of the device 20. The conductive band 129 connects to the annular pad 121 about the perimeter on a top surface 20a of the device 20. The annular pad 121 is electrically and mechanically coupled to the conductive band 129 and, thus, the bottom electrode. The top electrode 110 on the top surface 20a is isolated from the annular pad 121 and, thus, the bottom electrode 120 by the insulating gap 115.

Figure 3A:
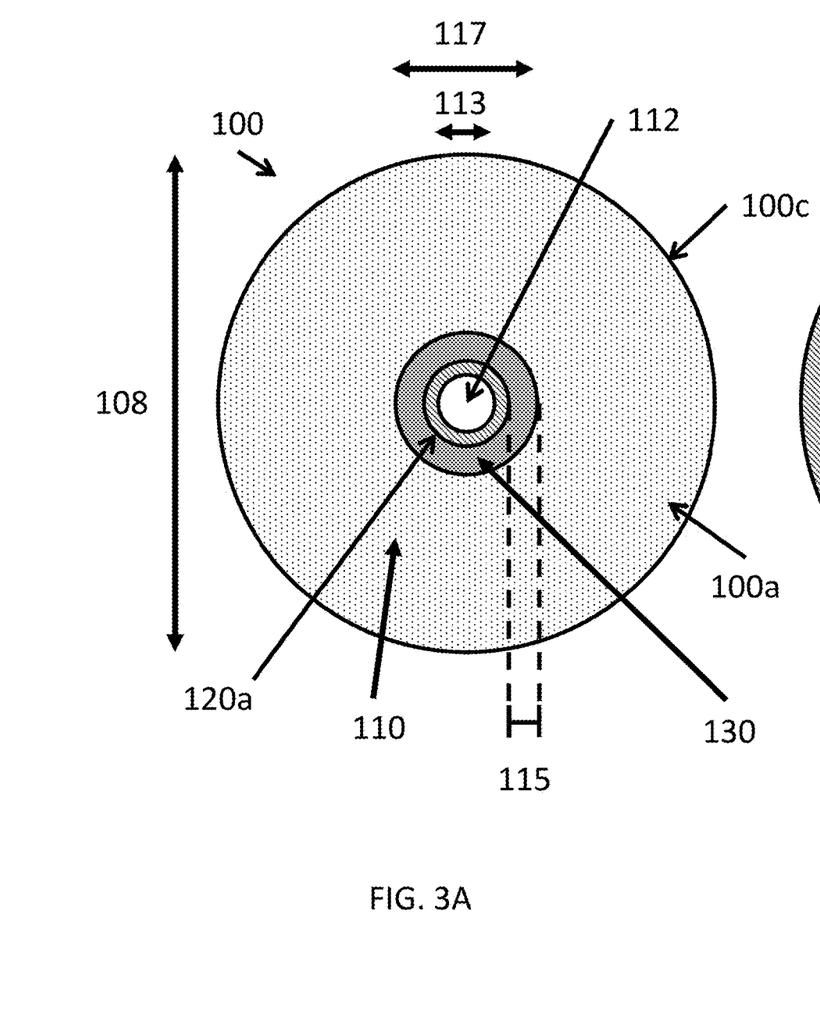
FIG. 3A-3D illustrate top, bottom, edge, and center cross-sectional views, respectively, of an electrical device having one or more via holes providing electrode pair access on a single side of the device in accordance with various embodiments of the present application.
Figure 3B:
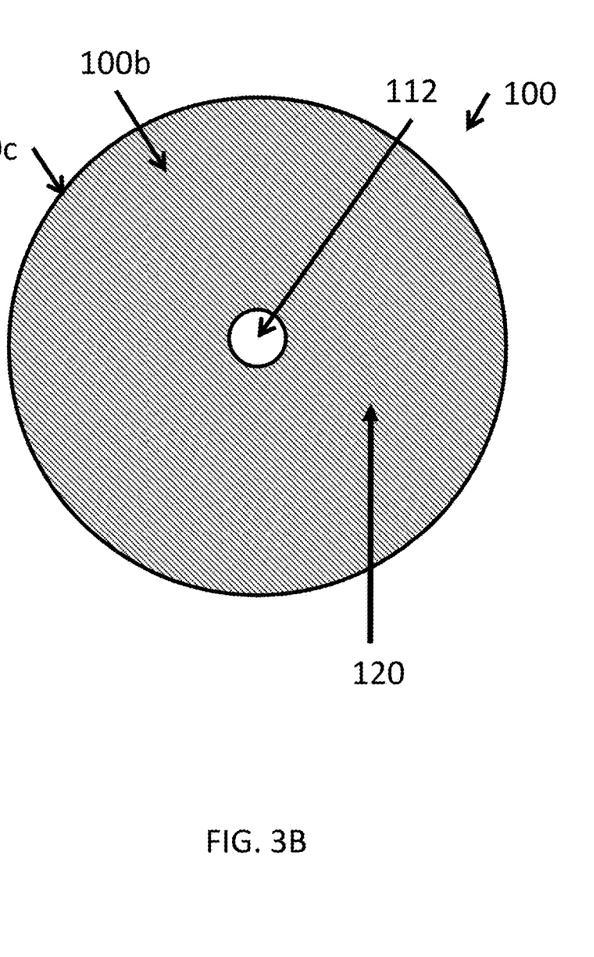
Figure 3C:
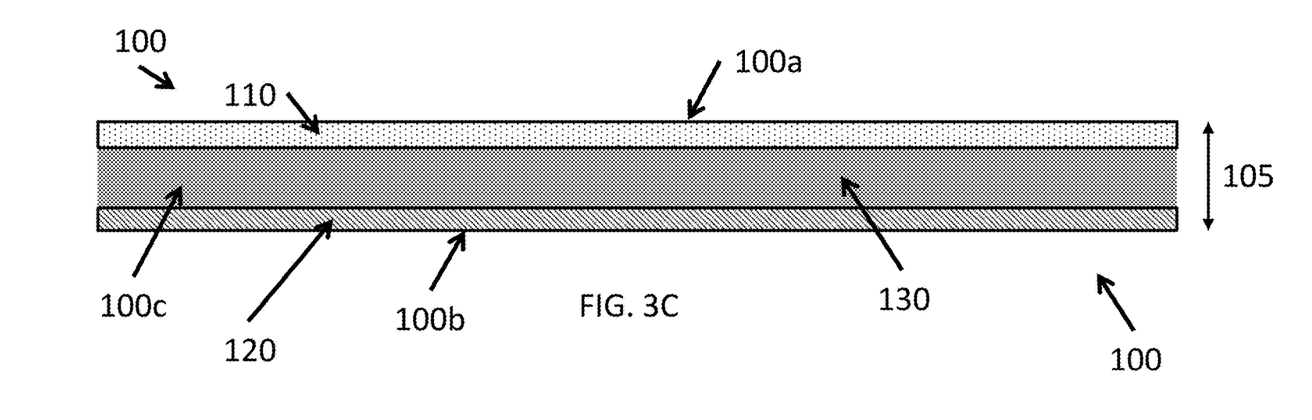
Figure 3D:
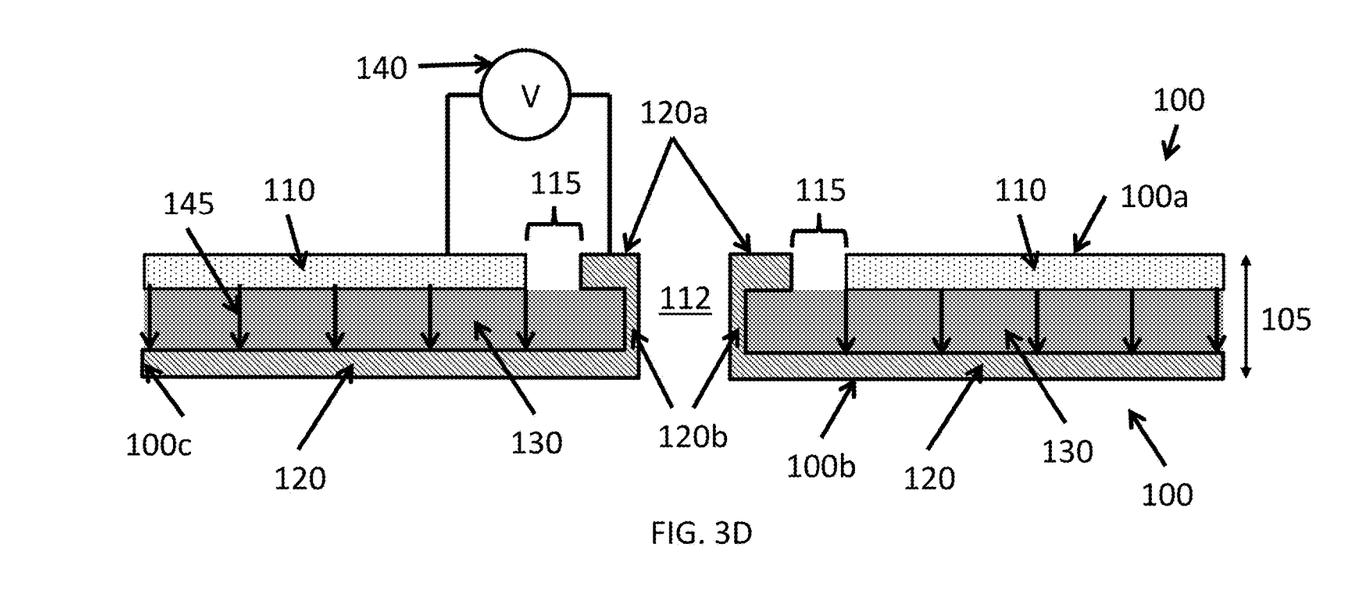

FIGS. 3A and 3B illustrate top and bottom views, respectively, of a device 100 having one or more via holes providing electrode pair access on a single side of the device 100 in accordance with various embodiments of the present application. FIGS. 3C and 3D illustrate an edge view and a center cross-sectional view, respectively, of the device 100. Exemplary devices and methods described herein employ an "inner wrap through" electrode that can also be termed a "piezo via-electrode."

The device 100 includes a top electrode 110 on at least a portion of the top surface 100a, a bottom electrode 120 on at least a portion of the bottom surface 100b, a device layer 130, and a via hole 112 including a conductive sidewall 120b. The bottom electrode 110 is electrically connected to the conductive sidewall 120b of the via hole 112. A pad electrode 120a on the top surface 100a of the device 100 is mechanically and electrically coupled to the conductive sidewall 120b of the via hole 112. The pad electrode 120a, conductive sidewall 120b, and bottom electrode 120 are all electrically and physically connected to form a single conductive pathway from the bottom surface 100b of the device to the top surface 100a. The top electrode 110 and the pad electrode 120a are separated by an insulating gap 115. By connecting the pad electrode 120a to the bottom electrode 120 through the via hole 112, the effective area of the device 100 in proportion to the total area of the device can be much larger than in conventional approaches because the area rendered ineffective by the hole 112, pad 120a, and insulating gap 115 at the inner diameter of device 100 is less than at the outer diameter of device 20.

In many embodiments, the device 100 does not include conducting electrode material (e.g., extensions of the top electrode 110 or bottom electrode 120) surrounding an outer sidewall 100c of the device 100. When the conductive material used to form the electrodes surrounds the outer sidewall 100c of the device (and, in particular, the device layer 130), the device layer 130 is physically constrained or encased.

In electromechanical applications such as piezoelectric actuators, the device layer 130 desires to expand and contract in response to the applied electric field. Similarly, piezoelectric sensors generate an applied electric field in response to deformation such as expansion or contraction. The conductive material is generally not piezo-reactive and so does not expand or contract with the material of the device layer 130 upon exposure to an electric field. By constraining the ability of the device layer 130 to expand and contract, conductive material surrounding the device layer on the outer sidewall 100c causes the device layer 130 to experience unnecessary mechanical struggle. As a result of the prior art designs, device sensitivities are reduced and higher voltages are required to create the same actuation. A higher voltage requirement consumes additional power and can lead to reduced lifetime for the devices. Systems and devices described herein avoid this mechanical struggle by connecting the bottom electrode 120 to the top surface 100a through the conductive sidewall 120b of the via hole 112 in the device 100. As a result, radial expansion of the device layer 130 outward from the middle is not inhibited.

In some embodiments described herein, the via hole 112 is formed in the device 100. Then, the bottom electrode 120 is wrapped into and through an inside diameter of the via hole 112 to form the conductive sidewall 120b and a small pad electrode 120a. The pad electrode 120a is electrically connected to the bottom electrode 120 by the conductive sidewall 120b. In some embodiments, the pad electrode 120a is formed adjacent to a perimeter of the via hole 112 on the top surface 100a. A thin insulating gap 115 is placed between the pad electrode 120a and the top electrode 110, roughly equivalent to a thickness 105 of the device 100 in some embodiments. In various embodiments, the thickness 105 of the device 100 can be in a range from 0.5 mm to 10 mm. The device can be characterized by a length, width, or diameter 108. In some embodiments, the diameter 108 of the device 100 can be in a range from 5 mm to 15 mm. In some embodiments, the diameter 108 of the device 100 is 9 mm. Although the device depicted in FIGS. 3A-3D has a circular shape, embodiments of the present disclosure can include devices 100 in any shape or conformation that meets application-specific requirements. For example, the device 100 can have a square, rectangular, oval, hexagonal, octagonal, or other polygonal shape. The device 100 can have in irregular shape in some embodiments.

In accordance with various embodiments, the top electrode 110 can be disposed on at least a portion of the top surface 100a of the device 100. In some embodiments, the bottom electrode 120 can be disposed on at least a portion of the bottom surface 100b of the device 100. The bottom electrode 120 can span the entirety of the bottom surface 100b of the device 100 in some embodiments. The top electrode 110 and bottom electrode 120 can be made of similar or dissimilar materials in various embodiments. In some embodiments, the conductive sidewall 120b, top electrode 110, or bottom electrode 120 can include a metal. In some embodiments, the top electrode 110, bottom electrode 120, or conductive sidewall 120b can include silver, gold, copper, platinum, titanium, or nickel. The material for the top electrode 110, bottom electrode 120, or conductive sidewalls 120b can be chosen based upon that material's conductivity and resistance to corrosion. In some embodiments, the top electrode 110, bottom electrode 120, or conductive sidewall 120b can include carbon such as in the form of carbon nanotubes or graphene. In some embodiments, the top electrode 110, the bottom electrode 120, or the conductive sidewalls 120b can be formed using "fired-on" techniques (e.g., silver), "silk-screen" techniques (e.g., silver), or electroplating techniques (e.g., nickel). In some embodiments, material for the top electrode 110, bottom electrode 120, or conductive sidewall 120b can be grown in situ (e.g., carbon forms such as nanotubes). As illustrated best in the edge view of FIG. 3C, the device 100 need not include a conductive layer on the outer sidewall 100c of the device 100 in most embodiments. Advantageously, the top electrode 110, bottom electrode 120, and device layer 130 can all extend to the outer sidewall 100c of the device 100 in some embodiments.

The device layer 130 enables production, use, or storage of electric potential by the device 100. The device layer 130 can comprise one or more distinct layers. In some embodiments, the device layer 130 can include layers that form or act as a battery. In some embodiments, the device layer 130 can include a piezoelectric element. The device layer 130 can include lead zirconate titanate (PZT) in some embodiments. In an exemplary embodiment, the device layer 130 can include a piezoceramic wafer that satisfies Navy Type PZT standards such as Navy Type II, for example. In some embodiments, the device layer 130 can expand radially outward or contract radially inward upon application of an electrical potential between the top electrode 110 and the bottom electrode 120. The device layer 130 can include a dielectric material in some embodiments. The device layer 130 can include a semiconducting material in some embodiments. The device layer 130 can produce electrical potential upon illumination by induction of a photocurrent in some embodiments.

The via hole 112 can be formed in the device 100 using different methods in accordance with various embodiments. For example, the via hole 112 can be drilled into the device in some embodiments using mechanical or fluidic means (e.g., fluid jets). In other embodiments, the via hole 112 can be created using methods such as wet or dry chemical etching or laser ablation. The via hole 112 can be placed at the center of the device 100 in some embodiments. For example, the via hole 112 can be located through a geometric origin or through a center of mass of the device 100. In accordance with various embodiments, the via hole 112 can have a length, width, or diameter 113. In some embodiments, the length, width, or diameter 113 of the via hole 112 can be in a range between 0.25 mm and 5 mm. In some embodiments, the length, width, or diameter 113 can be about 1 mm. In some embodiments, the choice of length, width, or diameter 113 of the via hole 112 is balanced with selection of the radius or width of the pad electrode 120a and the insulating gap 115. In some embodiments, annular thicknesses of each of the pad electrode 120a, the insulating gap 115, and the top electrode 110 are each greater than at least 0.25 mm. In some embodiments, the ratio between the annular thickness of the top electrode 110 and the pad electrode 120a is in a range from 2:1 to 10:1. In some embodiments, the via hole 112 can be disposed at a center of the top surface 100a, the bottom surface 100b, or both the top and bottom surfaces of the device.

In some embodiments, the device can include more than one via hole 112. At least one of the more than one via holes 112 can be offset from a center of the device 100. In some embodiments, at least one of the one or more via holes 112 can be disposed near, but not directly at, the center of the device 100. In some embodiments, the one or more via holes 112 can be used to mount the device 100 to a substrate. For example, a screw, rivet, or pin made of an insulating or dielectric material can be inserted through the via hole 112 to attach to the mount or substrate.

In some embodiments, the screw, rivet, or pin can be made of a conducting material and can form part of the conducting path between the bottom electrode 120 and the pad electrode 120a. In other words, a top portion of the screw, rivet, or pin (e.g., a head of the screw) can mechanically and electrically contact the pad electrode 120a while a bottom portion of the screw, rivet, or pin (e.g., threads of a screw or shaft of a pin) can mechanically and electrically contact the bottom electrode 120. In some embodiments, the connection between the screw, rivet, or pin and the bottom electrode 120 or pad electrode 120a can be indirect such as through an intervening substrate, washer, or nut.

The bottom electrode 120 connects to the pad electrode 120a through the conductive sidewall 120b of the via hole 112. Formation of the conductive sidewall 120b can be accomplished using a variety of methods. For example, a wall on the inner diameter of the via hole 112 can be made conductive using diffusion or deposition processes. The wall on the inner diameter can be plated with metal in some embodiments. The conductive sidewall 120b can be formed around the entirety of the inner diameter of the via hole 112 or on only a portion of the inner diameter of the via hole 112 in various embodiments. In some embodiments, the via hole 112 can be filled with conductive material. For example, very small diameter 113 via holes 112 may benefit from filling the via hole 112 rather than plating the sidewall due to the sizes involved. In such an embodiment, the conductive sidewall 120b is still present as an outer diameter of a plug extending through the via hole 112.

Formation of the pad electrode 120a can be accomplished using a variety of methods. For example, the pad electrode 120a can be formed by masking a portion of the top surface 110a of the device 100 and using diffusion or deposition processes. The pad electrode 120a can be plated in some embodiments. In some embodiments, the pad electrode 120a can be created contemporaneously with the conductive sidewall 120b (i.e., the conducting sidewall inside the via hole 112) of the bottom electrode 120 or at a different time. In some embodiments, the pad electrode 120a can be characterized by one or more lengths, widths, or diameters (e.g., an inner or outer diameter).

The pad electrode 120a is shown as having an annular (i.e., ring) shape in FIG. 3A. However, the pad electrode 120a can be formed in any of a variety of shapes for an application—specific purpose. For example, the pad electrode 120a can be square, rectangular, hexagonal, oval, octagonal, or any other polygonal or irregular shape. In some embodiments, the pad electrode 120a can have a hole or can include a complete surface. For example, the pad electrode 120a can extend over the via hole 112 to block or partially block the via hole 112 at the top surface 110a of the device 100 in some embodiments. Although the pad electrode 120a is depicted as surrounding the via hole 112 in FIG. 3A, the pad electrode 120a can contact only a portion of the via hole 112 in some embodiments.

The insulating gap 115 between the top electrode 110 and the pad electrode 120a prevents shorting between the two electrodes. The insulating gap 115 can include an insulating material such as a dielectric in some embodiments. The insulating gap 115 can include lead zirconate titanate (PZT) in some embodiments. In some embodiments, the insulating gap 115 can include an air gap or a vacuum gap wherein no material is placed into the insulating gap 115. The insulating gap 115 can be formed during formation of the pad electrode 120a in some embodiments. For example, the pad electrode 120a can be grown or deposited without overlapping the top electrode 110 leaving the insulating gap 115 in the form of an air gap. In other embodiments, the insulating gap 115 can be formed by removing material such as be etching, cutting, or ablating material from the pad electrode 120a or top electrode 110. In some embodiments and as shown in FIG. 3A, the insulating gap 115 can be an annular region. The insulating gap can be characterized by a length, width, or diameter. The insulating gap 115 can be characterized by both an outer diameter and an inner diameter in some embodiments. In some embodiments, the outer diameter 117 of the insulating gap 115 can be in a range from 1 mm to 5 mm. In some embodiments, the inner diameter of the insulating gap 115 is equivalent to an outer diameter of the pad electrode 120a. In some embodiments, the width of the insulating gap 115 can be approximately equal to the thickness 105 of the device 100.

As shown in the center cross-sectional view of FIG. 3D, a power system 140 can be connected to the top electrode 110 and the pad electrode 120a. The power system 140 can include a voltage source in some embodiments. When the power system 140 applies a voltage between the top electrode 110 and the pad electrode 120a, an electric field is established through the device layer 130 as illustrated by the electric field lines 145. In some embodiments such as sensing applications, activity in the device layer 130 (such as mechanical forces in a piezoelectric device or photocurrent generation in a solar cell device) can generate a current flow that is transferred through the pad electrode 120a and the top electrode 110 to the power system 140. In some embodiments, the power system 140 can apply an alternating voltage at a frequency between the top electrode 110 and the bottom electrode 120 to produce ultrasonic actuation. In some embodiments, the device can function as a speaker element. For example, the device layer 130 can receive mechanical vibrations and can generate a corresponding voltage between the top electrode 110 and the bottom electrode 120.

Figure 4A:
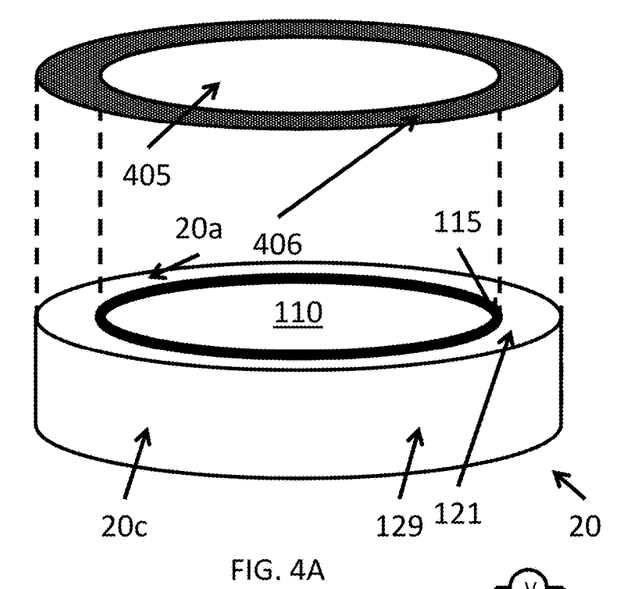
FIGS. 4A and 4B illustrate perspective and center cross-sectional views, respectively, indicating effective and ineffective areas of an electrical device having a prior art bull's eye electrode as illustrated in FIGS. 2A-2D.
Figure 4B:
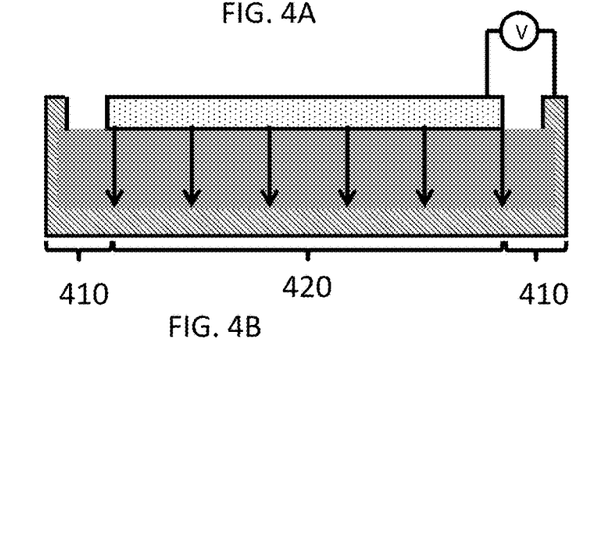

Systems and methods of the present disclosure produce devices with large effective areas compared to prior art devices. FIGS. 4A and 4B perspective and center cross-sectional views, respectively, indicating effective and ineffective areas of an electrical device having a prior art bull's eye electrode as illustrated in FIGS. 2A-2D. The effective or active area 405 is the area across the top surface 20a or the bottom surface 20b of the device 20 where the device layer 130 is able to generate, store, or use electrical potential. In a number of device types, the device layer 130 operates to generate, store, or use electrical potential in portions 420 of the device wherein the device layer 130 is sandwiched between the top electrode 110 and the bottom electrode 120. Conversely, portions 410 of the device wherein the device layer 130 is not sandwiched between the top electrode 110 and the bottom electrode 120 do not contribute to the storage, use, or generation of electrical potential. That is, portions 420 form an effective area 405 of the device 20 other portions 410 form an ineffective area 406 of the device 20. An objective of systems and methods of the present disclosure is to increase the effective area 405 of the device and to decrease the ineffective area 406 of the device.

Figure 5A:
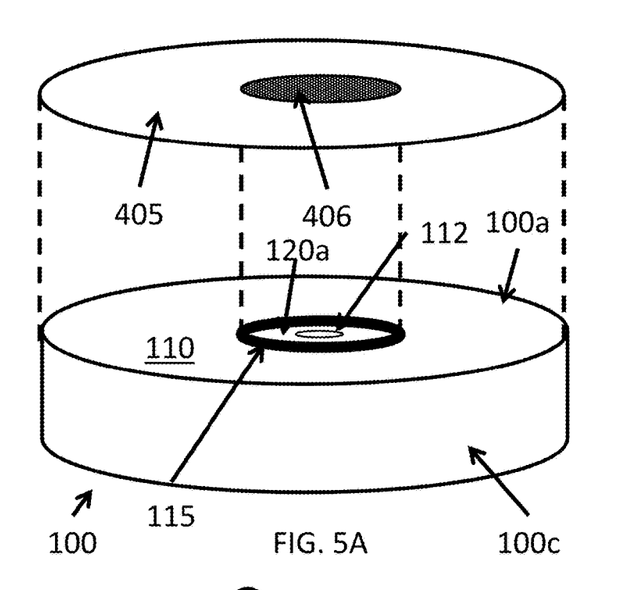
FIGS. 5A-5B illustrate perspective and center cross-sectional views, respectively, indicating effective and ineffective areas of the electrical device as illustrated in FIGS. 3A-3D.
Figure 5B:
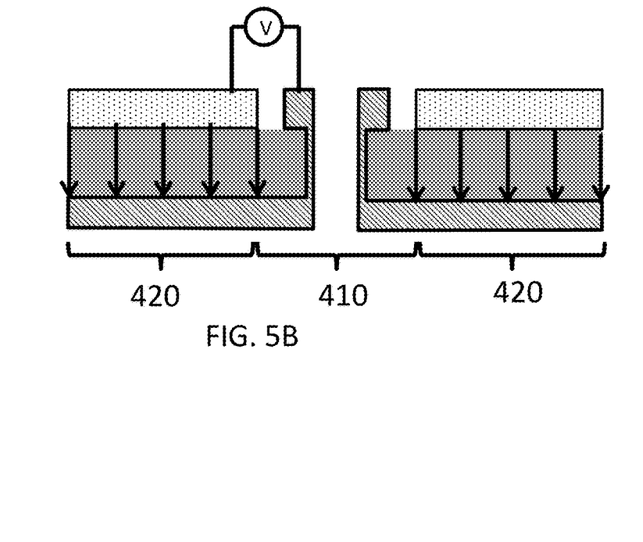

FIGS. 5A-5B illustrate perspective and center cross-sectional views, respectively, indicating effective and ineffective areas of the electrical device as illustrated in FIGS. 3A-3D In the embodiment shown in FIGS. 5A and 5B, the via hole 112 is located at the center of the device 100. By connecting the bottom electrode 120 to the pad electrode 120a through the conductive sidewall 120b of the via hole 112, the ineffective area 406 in the device 100 (e.g., the area occupied by the via hole 112, the pad electrode 120a, and the insulating gap 115) is substantially smaller than the ineffective area in the bull's eye device 20 of FIGS. 4A-4B where similar elements are located near the outer sidewall 20c of the device 20. This effect arises out of the geometrical configuration because annular areas are smaller for smaller values of radius. For example, the device 20 may have an overall radius of 4.25 mm while the radius of the top electrode is 3.5 mm. As a result, the ineffective area as a percentage of total area on the top surface 20a is represented as $(4.25^2-3.5^2)/4.25^2=32.1\%$. For the device 100, the outer radius of the insulating gap 115 (e.g., inner radius of the top electrode 110) may be 1.25 mm while the radius of the device is 4.25 mm. The ineffective area 406 of the device 100 as a percentage of total area on the top surface 100a is thus $1.25^2/4.25^2=8.6\%$. In some embodiments, devices 100 described herein can have a ratio of ineffective area to total area of the top surface 100a or bottom surface 100b of less than 10%.

Embodiments that include the via hole 112 at the center of the device 100 also locate the ineffective area 406 at the center of the device 100. Such an arrangement does not adversely unnecessary mechanical struggle of the device layer 130 against a conductive band 129 around the outer sidewall 20c of the device 20. Effectiveness of a device can be measured in a variety of ways. For example, the effectiveness of an actuator can be measured as a level of actuating force provided in response to a fixed amplitude sinusoidal voltage applied to the device. Similarly, the effectiveness of a sensor can be measured as voltage response amplitude provided a constant sinusoidal input strain.

Figure 6:
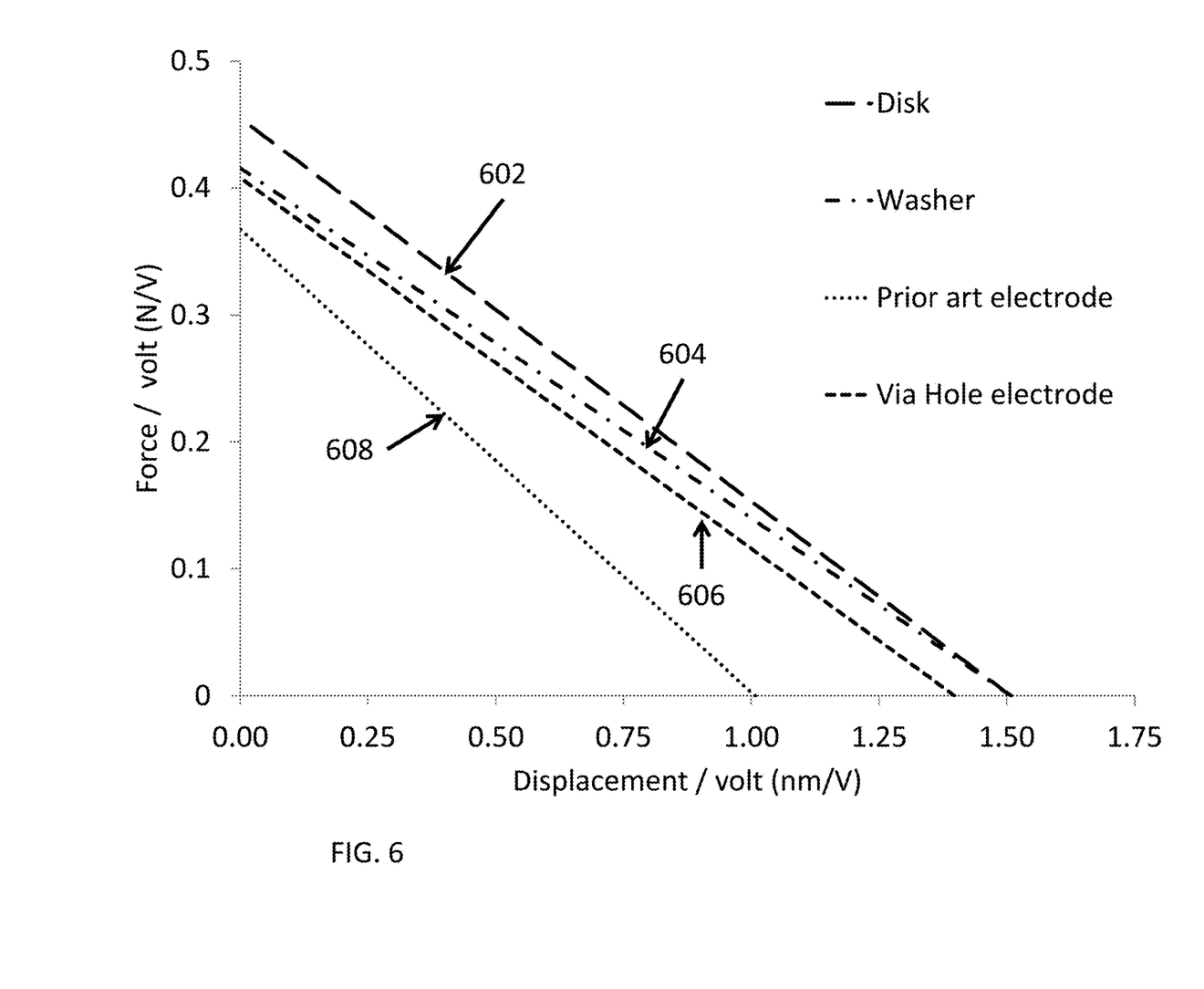
FIG. 6 illustrates modeled force/volt vs. displacement/volt curves for piezo devices including a piezoelectric device having one or more via holes as described herein.

FIG. 6 illustrates modeled force/volt vs. displacement/volt curves for piezo devices including the device 100 having one or more via holes 112 as described herein. The curves were developed using finite element modeling techniques wherein each device is modeled as a collection of discrete elements. Curve 702 illustrates characteristics for an idealized disk-shaped piezo device with no holes. Curve 704 illustrates characteristics of an idealized "washer" shaped device with a hole through the center. Curve 706 illustrates characteristics of the device 20 including a bull's eye prior art electrode design as described with reference to FIGS. 2A-2D. Curve 708 illustrates characteristics of the device 100 having the via hole 112 with conductive sidewall 120 as described above with reference to FIGS. 3A-3D. For sensor applications, a piezo device that exhibits high displacement is desirable. The models predict that, in particular while bonded to stiff substrates, systems and methods using the disclosed single-sided via approach (curve 708) lose only 5% displacement effectiveness as compared to the idealized disk model (curve 702). Conversely, prior art electrode designs (curve 706) are predicted to lose more than 25% of the idealized displacement effectiveness (curve 702). In addition, one finds that more elements of the finite element model are present in the ineffective area 406 of the prior art bull's eye device 20 of FIGS. 2A-2D than are present in the ineffective area 406 of devices of the present disclosure, which is consistent with findings described above.

In some embodiments, devices according to the present disclosure can be optimized for circuit board population by treating them like standard electrical components. For example, devices as taught herein can be stored in a tape-and-reel assembly with a common orientation for dispensing during circuit board population. The tape-and-reel assembly can be placed into a larger assembly that includes a pick-and-place machine that is fed using the tape-and-reel. Because devices disclosed herein provide access to both electrodes on a single side, the devices can be attached to printed circuit boards or other mounts or substrates using standard processes for mounting devices such as integrated circuit chip packages. For example, devices according to some embodiments of the present disclosure can be soldered using conventional electronic hardware approaches (e.g., solder paste in a re-flow oven) for a very precise but low-cost assembly.

Figure 7A:
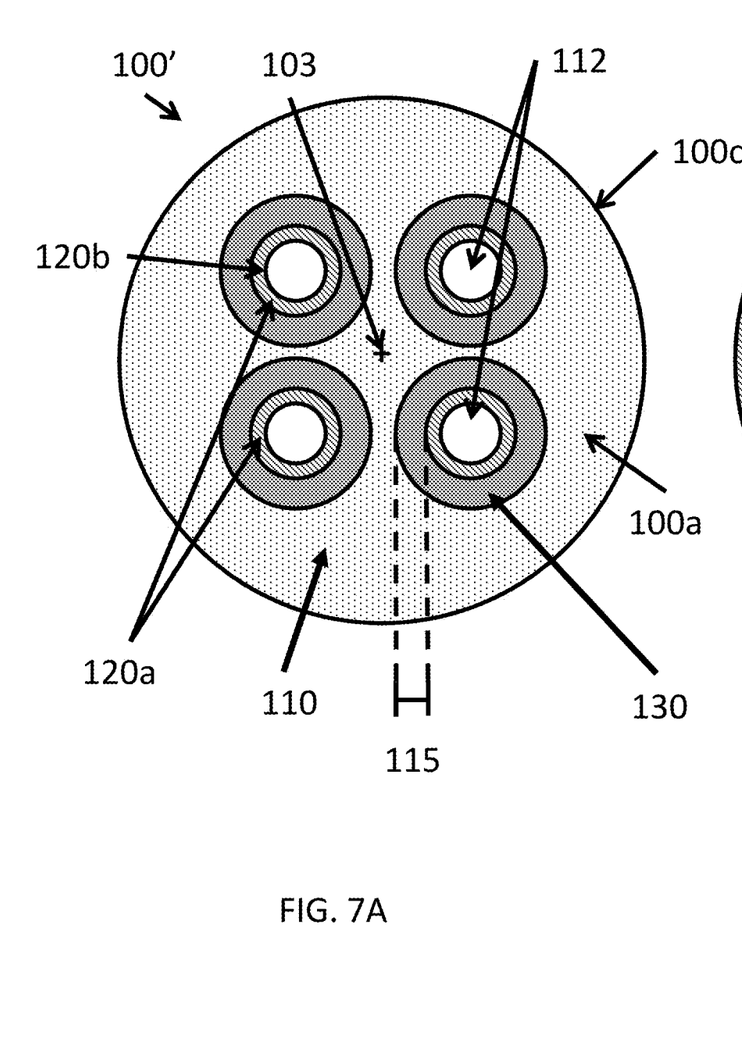
FIGS. 7A-7B illustrate top and bottom view, respectively, of an electrical device having one or more via holes located away from a center axis and providing electrode pair access on a single side of the device in accordance with various embodiments of the present application.
Figure 7B:
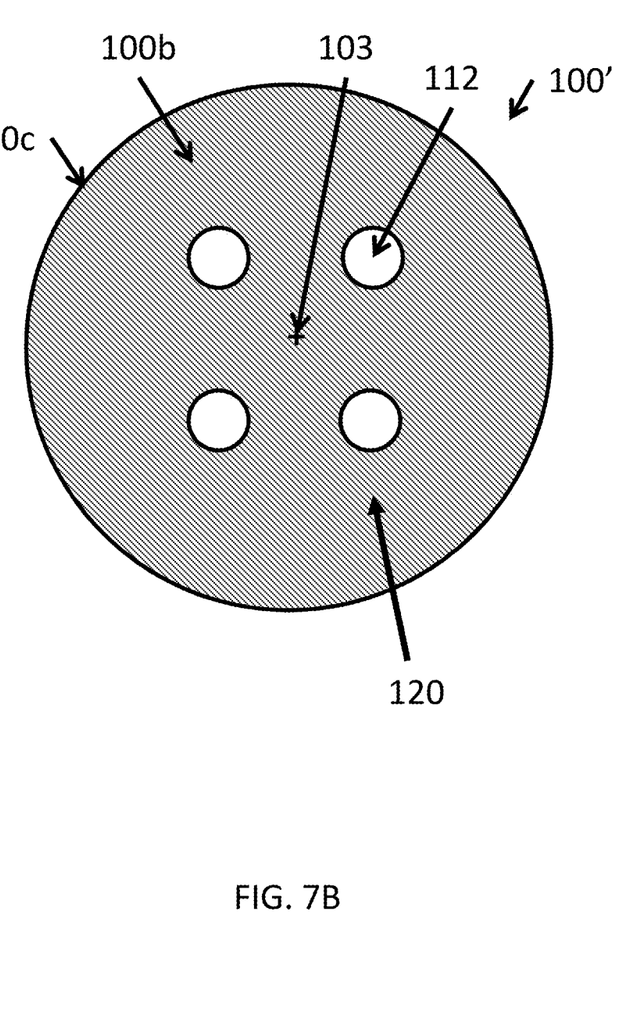

FIGS. 7A and 7B illustrate top and bottom views, respectively, of an electrical device 100' having one or more via holes located away from a center axis and providing electrode pair access on a single side of the device in accordance with various embodiments of the present application. The device 100' includes the top electrode 110 on the top surface 100a, the bottom electrode 120 on the bottom surface 100b, and the device layer 130. The device 100' includes more than one via hole 112. Each via hole 112 can have a conductive sidewall 120b that is mechanically and electrically coupled to the bottom electrode 120. The pad electrodes 120a on the top surface 110a of the device 100' are mechanically and electrically coupled to respective conductive sidewalls 120b. Each pad electrode 120a is separated from the top electrode 110 by a respective insulating gap 115.

In the device 100', the via holes 112 are not placed through a center or a center axis 103 of the device 100'. At least one of the more than one via holes 112 can be offset from a center of the device 100'. For example, the via holes 112 could be placed symmetrically with respect to a center axis 103 or center of mass of the device 100'. The use of multiple via holes 112 offset from the center can be advantageous in applications where generation, use, or storage of electrical potential is especially important at the center of the device because the center of the device is unperturbed. Although placement of the via holes 112 does not need to be symmetric, it may be advantageous in some embodiments to place the via holes symmetrically with respect to the center axis 103 to allow for even expansion of the device layer 130 in all directions. In embodiments where the via holes 112 are used for mounting the device 100', symmetric placement of the via holes 112 can allow for more stable mounting and even pressure placed by the mounting pins or screws on all portions of the device.

Figure 8:
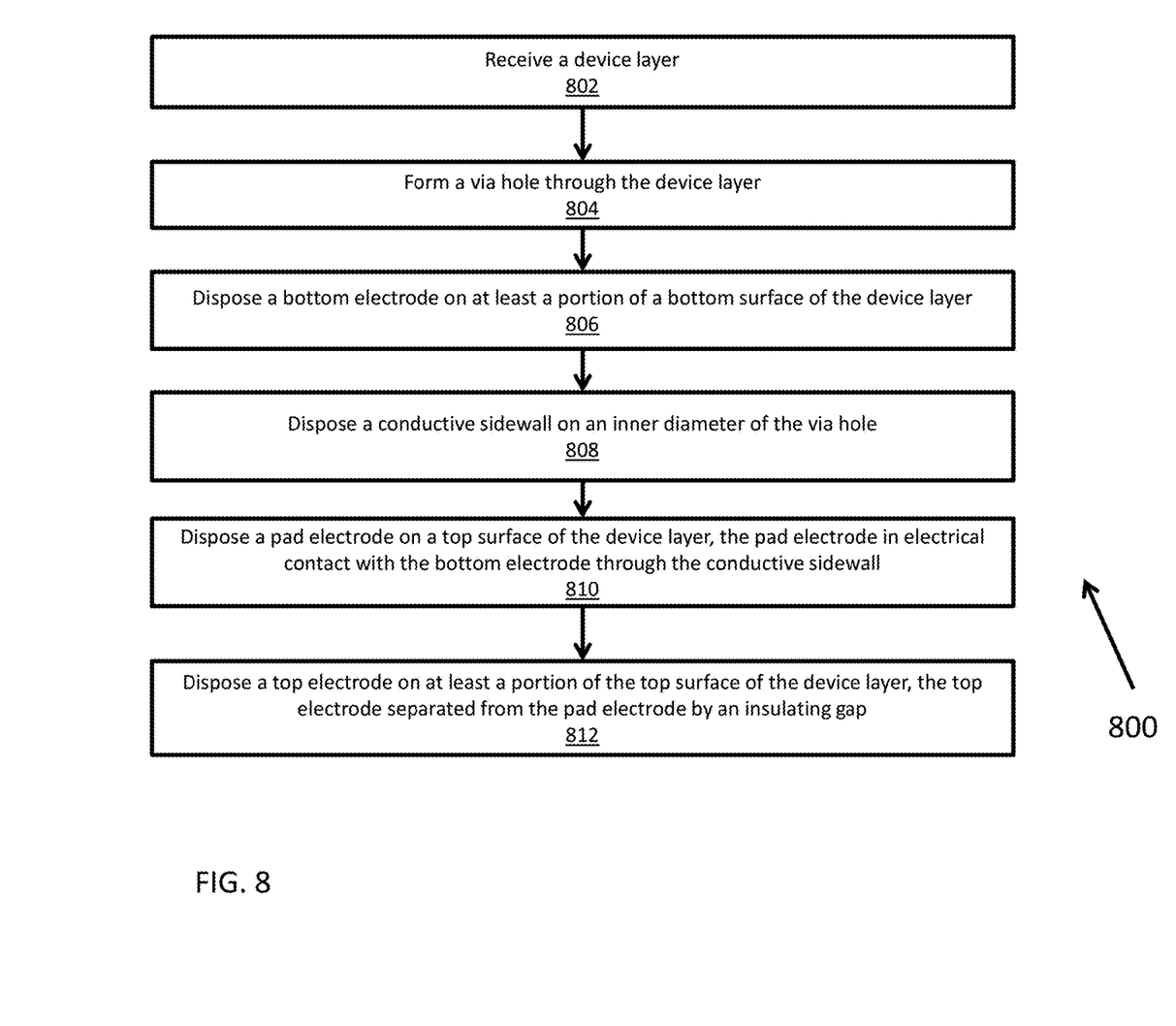
FIG. 8 illustrates a flowchart for a method of producing an electrical device having one or more via holes providing electrode pair access on a single side of the device in accordance with various embodiments of the present application.

FIG. 8 illustrates a flowchart for a method 800 of producing a device having one or more electrical via holes providing electrode pair access on a single side of the device in accordance with various embodiments of the present application. The method 800 includes receiving the device layer 130 (step 802). The device layer 130 can include the device layer 130 as described above with reference to FIGS. 3A-3D in some embodiments. In some embodiments, the device layer 130 may be provided or formed in one or more earlier process steps. The method 800 includes forming the via hole 112 through the device layer 130 (step 804). For example, the via hole 112 can be formed through the device layer 130 using mechanical drilling, etching, or laser ablation as described above with reference to FIGS. 3A-3D. In some embodiments, the steps of receiving the device layer 130 and forming the via hole 112 can be performed as a single step. In other words, the device layer 130 can be formed or received already including the via hole 112 in some embodiments.

The method 800 includes disposing a bottom electrode 120 on a bottom surface of the device layer 130 (step 806). The bottom electrode 120 can form at least a portion of the bottom surface 100b of the device 100. The method 800 includes disposing the conductive sidewall 120b on an inner diameter of the via hole 112 (step 808). For example, the conductive sidewall 120b can be formed using diffusion or deposition processes. The method 800 includes disposing the pad electrode 120a on a top surface of the device layer 130 (step 810). The pad electrode 120a is in electrical contact with the bottom electrode 120 through the conductive sidewall 120b. The method 800 includes disposing the top electrode 110 on a portion of the top surface of the device layer 130 (step 812). The top electrode 110 is separated from the pad electrode 120a by an insulating gap 115. For example, the top electrode 110 can be deposited in such a way as to leave the insulating gap 115 between the top electrode 110 and pad electrode 120a or material can be removed for to form the insulating gap 115. The top electrode 110 forms at least a portion of the top surface 100a of the device 100.

In some embodiments, the method 800 can be performed in such a way as to form multiple devices simultaneously. For example, a single large-scale wafer or set of layers can be used to form device layers 130 in multiple devices 100, 100'. Multiple via holes 112 can be formed in the large-scale wafer. The top electrode 110, bottom electrode 120, pad electrode 120a, and conductive sidewall 120b can be formed using a technique such as electroplating, firing on, or silk screening. The insulating gap 115 can be formed using laser ablation or etching. Each resulting device can be core drilled or diced out from the large-scale wafer.

In describing exemplary embodiments, specific terminology is used for the sake of clarity. For purposes of description, each specific term is intended to at least include all technical and functional equivalents that operate in a similar manner to accomplish a similar purpose. Additionally, in some instances where a particular exemplary embodiment includes a plurality of system elements, device components or method steps, those elements, components or steps may be replaced with a single element, component, or step. Likewise, a single element, component, or step may be replaced with a plurality of elements, components, or steps that serve the same purpose. Moreover, while exemplary embodiments have been shown and described with references to particular embodiments thereof, those of ordinary skill in the art will understand that various substitutions and alterations in form and detail may be made therein without departing from the scope of the invention. Further still, other embodiments, functions, and advantages are also within the scope of the invention.

The invention claimed is:

1. An electrical device having one or more via holes providing electrode pair access on a single side of the device comprising:
    a top electrode on at least a first portion of a top surface of the device;
    a pad electrode on at least a second portion of the top surface of the device;
    a bottom electrode on at least a portion of a bottom surface of the device;
    a device layer disposed between the top electrode and the bottom electrode;
    a via hole having a conductive inner sidewall disposed at a center of the device and extending between the top surface and the bottom surface, the conductive inner sidewall extending circumferentially about an inner diameter thereof and in electrical contact with the pad electrode and the bottom electrode; and
    an insulating gap separating the pad electrode from the top electrode on the top surface of the device.

2. The device of claim 1, wherein the device generates an electric potential between the top electrode and the bottom electrode.

3. The device of claim 1, wherein the device stores an electric potential between the top electrode and the bottom electrode.

4. The device of claim 1, wherein the device layer comprises a piezoelectric material.

5. The device of claim 4, wherein the device layer expands radially outward or contracts radially inward upon application of an electric potential between the top electrode and the bottom electrode.

6. The device of claim 1, wherein the inner diameter of the via hole is in a range from 0.1 mm and 2 mm.

7. The device of claim 1, wherein an ineffective area at a top face of the electrical device is less than 10% of a total area of the top face of the electrical device.

8. The device of claim 1, wherein the insulating gap includes an air gap.

9. The device of claim 1, wherein the device has a circular shape.

10. The device of claim 9, wherein a diameter of the circular device is in a range from 5 mm to 15 mm.

11. A method of producing an electrical device having one or more electrical via holes providing electrode pair access on a single side of the device, comprising:
    receiving a device layer;
    forming a hole having an inner diameter through a center of the device layer and extending between a top surface and a bottom surface of the device layer;
    disposing a bottom electrode on at least a portion of the bottom surface of the device layer;
    disposing a conductive sidewall on the inner diameter of the hole, the conductive inner sidewall extending circumferentially about the inner diameter of the hole;
    disposing a pad electrode on at least a first portion of the top surface of the device layer, the pad electrode in electrical contact with the bottom electrode through the conductive sidewall to form a conductive via hole with an inner diameter; and
    disposing a top electrode on at least a second portion of the top surface of the device layer, the top electrode separated from the bottom electrode by an insulating gap.

12. The method of claim 11, wherein the resulting device generates an electric potential between the top electrode and the bottom electrode.

13. The method of claim 11, wherein the resulting device stores an electric potential between the top electrode and the bottom electrode.

14. The method of claim 11, wherein the device layer comprises a piezoelectric material.

15. The method of claim 14, wherein the device layer in the resulting device expands radially outward or contracts radially inward upon application of an electric potential between the top electrode and the bottom electrode.

16. The method of claim 11, wherein the inner diameter of the conductive via hole is in a range from 0.1 mm and 2 mm.

17. The method of claim 11, wherein an ineffective area at a top surface of the resulting electrical device is less than 10% of a total area of the top surface of the electrical device.

18. The method of claim 11, wherein the insulating gap includes an air gap.

19. The device of claim 11, wherein the resulting electrical device has a circular shape.

20. The method of claim 19, wherein the resulting electrical device has a diameter in a range from 5 mm to 15 mm.

* * * * *